(12) United States Patent
Lien

(10) Patent No.: US 7,215,540 B2
(45) Date of Patent: May 8, 2007

(54) MEMORY MODULE

(75) Inventor: Shih-Hsiung Lien, Taipei (TW)

(73) Assignee: Optimum Care International Tech. Inc., Taipei (TW)

( * ) Notice: Subject to any disclaimer, the term of this patent is extended or adjusted under 35 U.S.C. 154(b) by 370 days.

(21) Appl. No.: 11/008,901

(22) Filed: Dec. 10, 2004

(65) Prior Publication Data

US 2005/0146856 A1 Jul. 7, 2005

(30) Foreign Application Priority Data

Dec. 10, 2003 (TW) .............................. 92221731 U

(51) Int. Cl.
- G06F 1/16 (2006.01)
- H05K 5/00 (2006.01)
- H05K 7/00 (2006.01)
- H05K 1/14 (2006.01)
- H01R 12/16 (2006.01)

(52) U.S. Cl. ....................... 361/684; 361/785; 361/803

(58) Field of Classification Search ................ 361/684, 361/785, 790, 803
See application file for complete search history.

(56) References Cited

U.S. PATENT DOCUMENTS 4,656,605 A * 4/1987 Clayton ........................ 365/52

* cited by examiner

Primary Examiner—Tuan Dinh
Assistant Examiner—Ivan Carpio

(57) ABSTRACT

A memory module includes a plurality of memory units, an assembling holder and an engaging arrangement. The assembling holder includes an elongated unit housing having at least an elongated receiving slot extended therealong. The engaging arrangement includes a first assembling joint provided at a side edge portion of one of the memory substrates, and a second assembling joint provided at a corresponding side edge portion of an adjacent memory substrate, wherein the first assembling joint is fittedly and detachably engaged with the second assembling joint of the adjacent memory unit to alignedly couple the memory units with each other in an edge to edge manner to inset into the receiving slot of the elongated unit housing.

20 Claims, 6 Drawing Sheets

MEMORY MODULE

BACKGROUND OF THE PRESENT INVENTION

1. Field of Invention

The present invention relates to a memory module, and more particularly to a memory module comprising a plurality of individual memory units electrically connected with an elongated unit housing for electrically connecting with a memory slot of a motherboard.

2. Description of Related Arts

Memory modules are a kind of standardized component widely used in electrical products such as desktop computers, laptop computers, industrial computers, and printers. Along with the advancing movement of the information technology, the world witnesses the memory capacity of the memory device have been volumetrically expanded and meanwhile, the retrieving speed from the memory device have been significantly reduced. However, the principle structure of the memory device has never been improved to comply with this dramatic change. Commonly, a conventional memory module comprises a unified substrate and a plurality of memory chips spacedly provided on the unified substrate. In case where the unified substrate is damaged, all memory chips, which are welded on the unified substrate, have to be detached from unified substrate first, and then be welded on a new substrate. On the other hand, if the memory chip is damaged, the above mentioned repairing procedure is followed too. Accordingly, the damaged memory chip must be detached from the unified substrate in order to replace a brand new memory chip thereon. As a result, this kind of time consuming and laborious repairing procedure virtually increases the maintenance costs of memory module.

In addition, providing an efficient after-sales service is an advantageous business method in a highly competitive marketing environment today. It is unquestionable that a prolonged repairing period of memory module will be harmful to the service reputation of the manufactures among customers. Moreover, the suppliers of the memory module have to maintain a quantity of memory module stock for potential reparations and exchanges from customers, therefore causing an unnecessary increase of the cost and some undesirable dead stock.

SUMMARY OF THE PRESENT INVENTION

A main object of the present invention is to provide a memory module comprising a plurality of individual memory units electrically connected with an elongated unit housing for conducting with a memory slot of a motherboard. In other words, individual memory units are detachably combined to form a memory module so as to maximize maintenance flexibility and minimize operation inconvenience.

Another object of the present invention is to provide a memory module wherein each individual memory unit can be easily replaced if defective so as to minimize the cost and the time required for the relevant maintenance procedure.

Another object of the present invention is to provide a memory module which would minimize the stock required for maintenance so as to minimize the cost of maintenance or warranty and therefore ultimately the selling price of the present invention.

Another object of the present invention is to provide a memory module which is compatible with typical motherboards so as to universalize for widespread application of the present invention.

Accordingly, in order to accomplish the above objects, the present invention provides a memory module, comprising:

a plurality of memory units, each of which comprises a memory substrate, at least a memory chipset having a predetermined memory capacity mounted on the memory substrate, and an electric terminal provided at a lower edge portion of the memory substrate;

an assembling holder comprising an elongated unit housing having at least an elongated receiving slot extended therealong and a signal terminal provided along the unit housing; and an engaging arrangement which comprises a first assembling joint provided at a side edge portion of one of the memory substrates, and a second assembling joint provided at a corresponding side edge portion of an adjacent memory substrates, wherein the first assembling joint of the memory unit is fittedly and detachably engaged with the second assembly joint of the adjacent memory unit to alignedly couple the memory units with each other in an edge to edge manner to fittedly inset into the receiving slot of the elongated unit housing.

These and other objectives, features, and advantages of the present invention will become apparent from the following detailed description, the accompanying drawings, and the appended claims.

DETAILED DESCRIPTION OF THE PREFERRED EMBODIMENT

Figure 1:
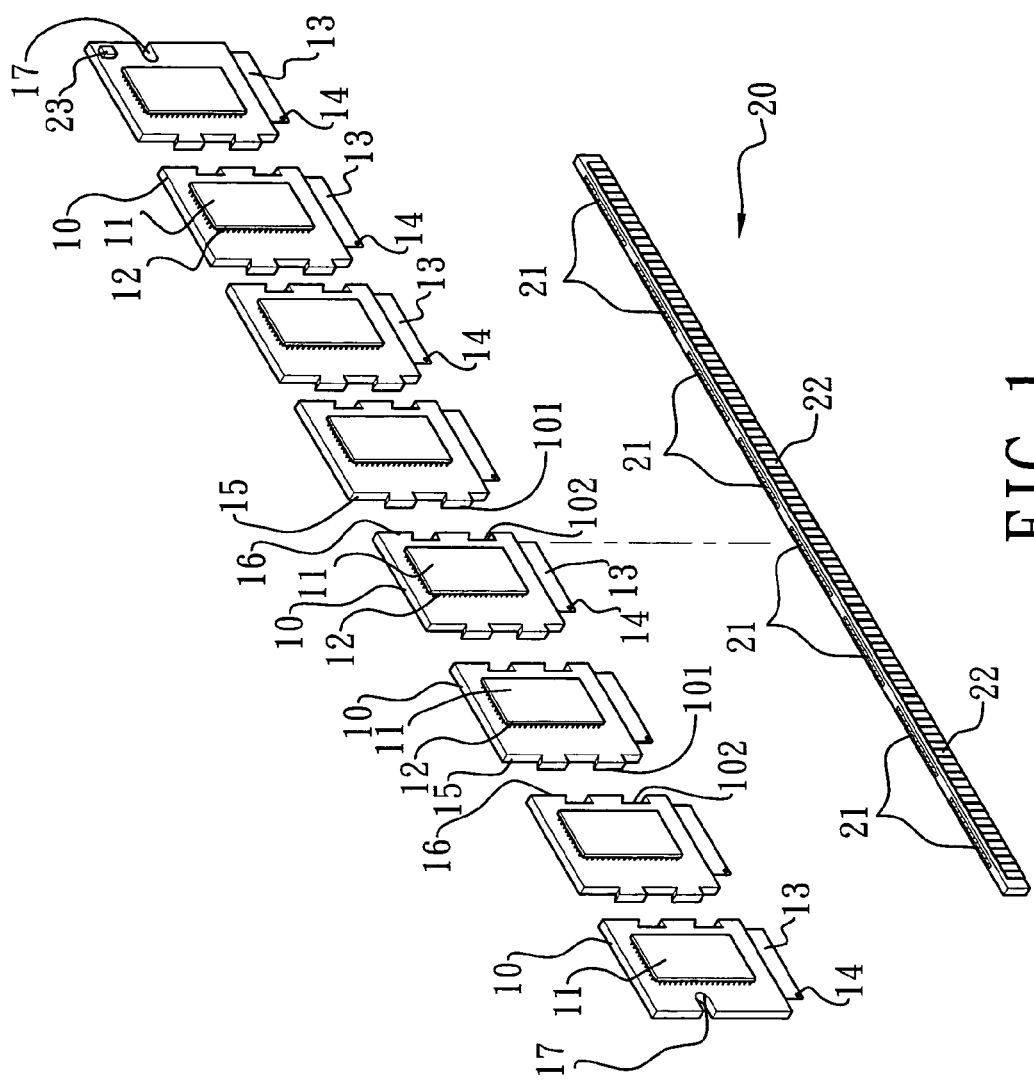
FIG. 1 is an exploded perspective view of a memory module according to a preferred embodiment of the present invention.
Figure 2:
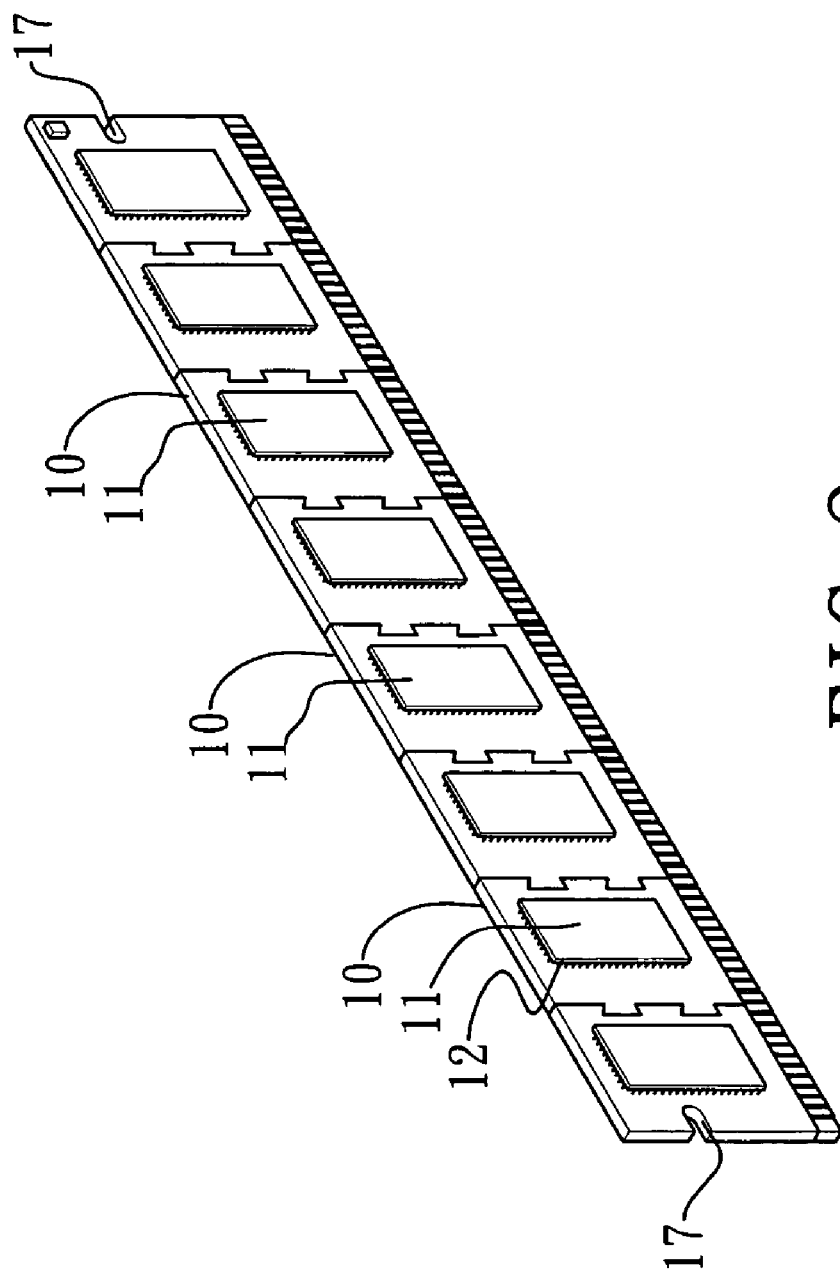
FIG. 2 a perspective view of the memory module according to the above preferred embodiment of the present invention.

Referring to FIG. 1 to FIG. 2 of the drawings, a memory module according to a preferred embodiment of the present invention is illustrated, in which the memory module comprises a plurality of memory units, an assembling holder 20, and an engaging arrangement.

Each of the memory units comprises a memory substrate 10, at least a memory chipset 11 having a predetermined memory capacity electrically mounted on the memory substrate 10, and an electric terminal 13 extended at a lower edge portion thereof. According to the preferred embodiment, the memory chipset 11 is electrically mounted on the respective memory substrate 10 through a chipset terminal 12 provided on that memory chipset 11.

The assembling holder 20 comprises an elongated unit housing having at least an elongated receiving slot 21 extended therealong, and a signal terminal 22 provided on an exterior surface along the unit housing.

The engaging arrangement comprises a first assembling joint 15 provided at a side edge portion of one of the memory substrates 10, and a second assembling joint 16 provided at a corresponding side edge portion of an adjacent memory substrate 10, wherein the first assembling joint 15 of the memory unit is fittedly and detachably engaged with the second assembly joint 16 of the adjacent memory unit to alignedly couple the two memory units with each other in an edge to edge manner so as to fittedly insert into the receiving slot 21 of the elongated unit housing.

Figure 3:
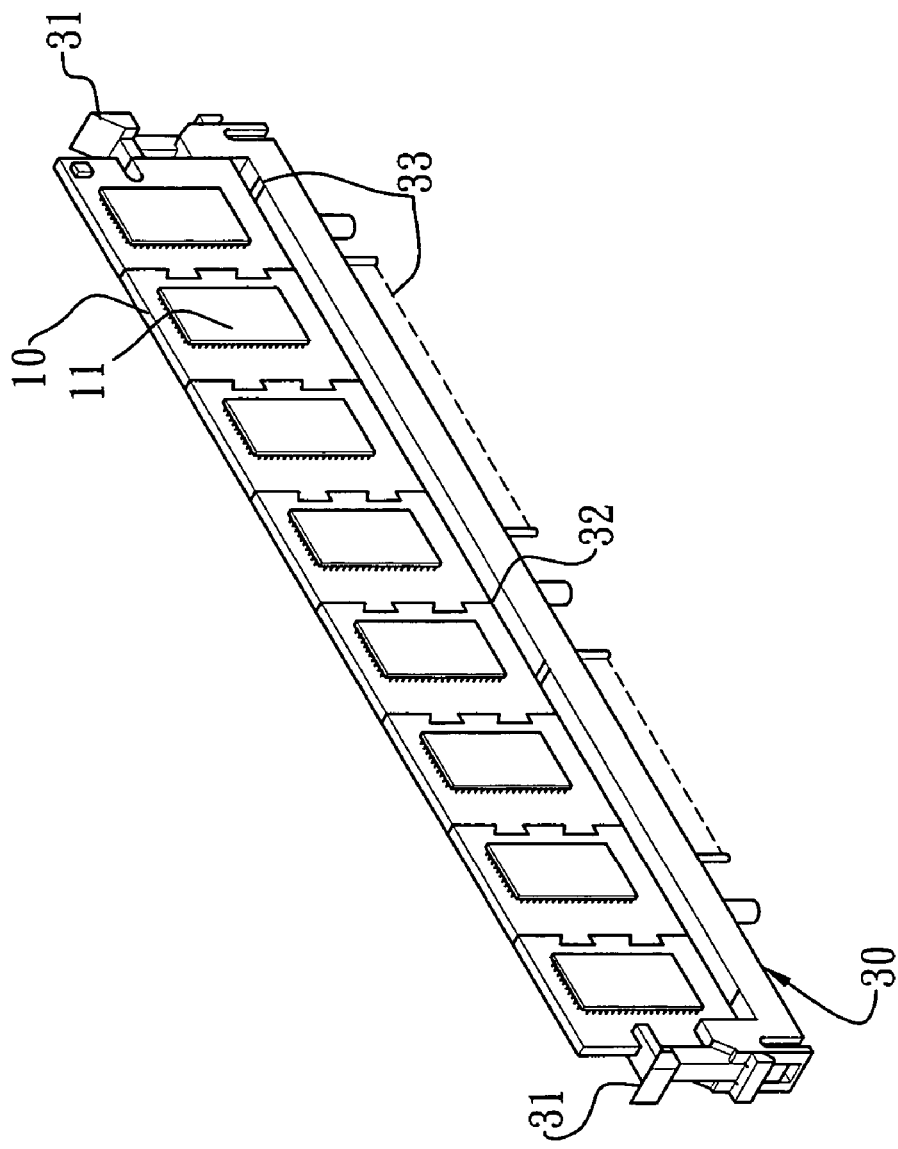
FIG. 3 is a schematic diagram of the memory module according to the above preferred embodiment of the present invention.

Specifically, the first assembling joint 15 comprises a first protruding tooth 101 integrally and outwardly protruded from the side edge portion of a particular memory substrate 10. The second assembling joint 16 has a second engaging slot 102 which is indently formed on the second memory substrate 10, and is shaped and sized to fittedly match with a shape and a size of the first protruding tooth 101 of the first assembling joint 15 so that when the first protruding tooth 101 of the first assembling joint 15 is fittedly engaged with the second engaging slot 102 of the second assembling joint 16, the two memory units in question are securely yet detachably interlocked with each other. The electric terminals 13 of the memory units are then adapted to fittedly inset into the receiving slot 21 of the elongated unit housing so as to form the memory module for inserting into a memory holder 30 provided on a typical motherboard, as shown in FIG. 3 of the drawings.

According to the preferred embodiment of the present invention, each of the first assembling joints 15 comprises a plurality of first protruding teeth 101 whereas a plurality of corresponding second engaging slots 102 are formed on the second assembling joint 16, and are substantially aligned with the respective first protruding teeth 101 such that the first protruding teeth 101 are adapted to engage with the respective second engaging slots 102 of the adjacent memory substrate 10.

Moreover, it is relatively easy to observe that, according to the preferred embodiment, the second assembling joint 16 also comprises a plurality of second protruding teeth 101 spacedly and outwardly protruded from a side edge portion of the corresponding memory substrate 10 to form each of the second engaging slots 102 between each two second protruding teeth 101.

In other words, the first assembling joint 15 further has a plurality of first engaging slots 102 each of which is formed between each two of the first protruding teeth 101 wherein each of the first protruding tooth 101 is substantially aligned with a corresponding second engaging slot 102 so as to engage therewith, as shown in FIG. 2 of the drawings.

Each of the protruding teeth 101 (no matter first or second) has an enlarged head portion sidewardly extended from the respective side edge portion of the memory substrate 10. Thus, each of the engaging slots 102 is sized and shaped to match with the size and shape of the respective protruding tooth 101. The result is that when the protruding teeth 101 is fittedly engaged with the respective engaging slot 102, the enlarged head portion of each of the protruding teeth 101 is interlocked with the respective engaging slot 102 to retain each two memory units in position within the elongated unit housing.

Also, referring to FIG. 1 of the drawings, the elongated unit housing further comprises means for restricting a lateral movement of the memory units. The restricting means comprises a plurality of slot dividers formed along the elongated unit housing to divide the receiving slot 21 into a plurality of slot portions therealong between each two slot dividers. Accordingly, each of the memory units is arranged to insert into one of the slot portions to contact with the elongated unit housing, wherein a lateral movement of each of the memory units is substantially restricted by the corresponding slot dividers.

In order that the memory units can be fittedly inserted into the respective slot portions of the receiving slot 21, a distance between each two electric terminals 13 when the corresponding memory units is properly engaged equals a distance between each two slot portions formed on the elongated unit housing.

Referring to FIG. 3 of the drawings, for the purpose of the preferred embodiment of the present invention, the memory module is adapted to electrically mount with a memory holder of a typical motherboard. The memory holder 30 usually comprises an elongated memory slot 32 for receiving the memory module, a plurality of data terminals 33 provided in the memory slot 32 for electrically connecting the memory module with the motherboard, and two holding arms 31 operatively extended from two ends of the memory slot 32 to engage with the memory module for securely retaining it in position in the memory slot 32.

Referring to FIG. 2 and FIG. 3 of the drawings, the memory module further has two mounting slots 17 indently formed on an outer side edge portion of two memory substrates 10 of the two outermost memory units respectively wherein the mounting slots 17 are adapted for engaging with the respective holding arm 31 of the memory holder 30.

Figure 4:
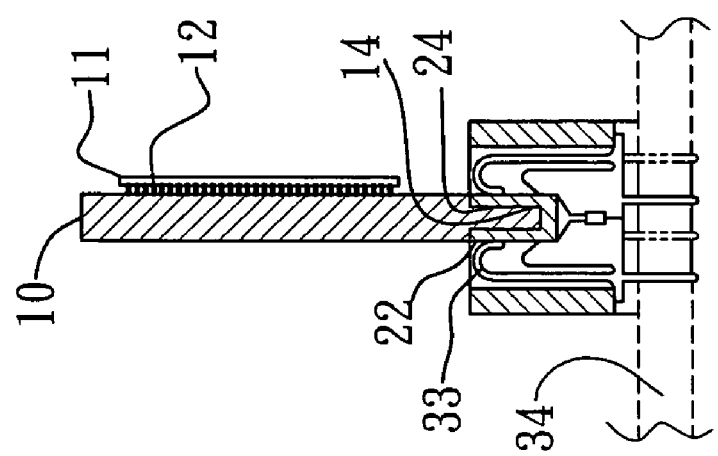
FIG. 4 is a sectional side view of the memory module according to the above preferred embodiment of the present invention.

Referring to FIG. 4 of the drawings, the assembling holder 20 further has a conductive element 24 provided at an inner wall of the elongated unit housing wherein a contacting portion 14 of each of the electric terminals 13 of each of the memory substrates 10 is electrically contacted with the conductive element 24, which is also electrically contacted with the signal terminal 22.

When the memory module is inserted into the memory holder 30 on the motherboard, the signal terminal 22 of the assembling holder 20 is arranged to electrically connect with the data terminal 33 of the memory holder 30 such that electronic data from the memory substrate 10 and the memory chipset 11 can be transferred to the motherboard through the signal terminal 22 and the data terminal 33. In other words, each of the memory units is electrically connected with each other through the conductive element 24 in the elongated unit housing and the respective electric terminal 13, and that each of the memory units is also electrically connected with the motherboard through connecting with the conductive element 24.

Referring to FIG. 1 to FIG. 3 of the drawings, the memory module further comprises an Electrically Erasable Programmable ROM (EEPROM) 23 electrically connected with one of the memory substrate 10 so as to comprehensively handle data from the individual memory substrates 10 and the respective memory chipsets 11. It is of course worth mentioning that all information transferred between the memory units and the motherboard must be accomplished through the electric terminal 13, the conductive element 24, and the signal terminal 22.

From the foregoing description, it could be seen that the above-mentioned objects have been substantially accomplished. When one or more memory units are found defective, a service provider may simply need to detach the defective memory unit from the assembling holder 20 and replace a new one. Since the first assembling joint 15 and the second assembling joint 16 can be engaged and disengaged easily, users can enjoy maximum convenience in installing and maintaining the memory module. In other words, unless all the memory units are defective and need replacement, the procedures, complexity, time, and the cost for maintenance of the present invention can be substantially minimized.

Figure 5:
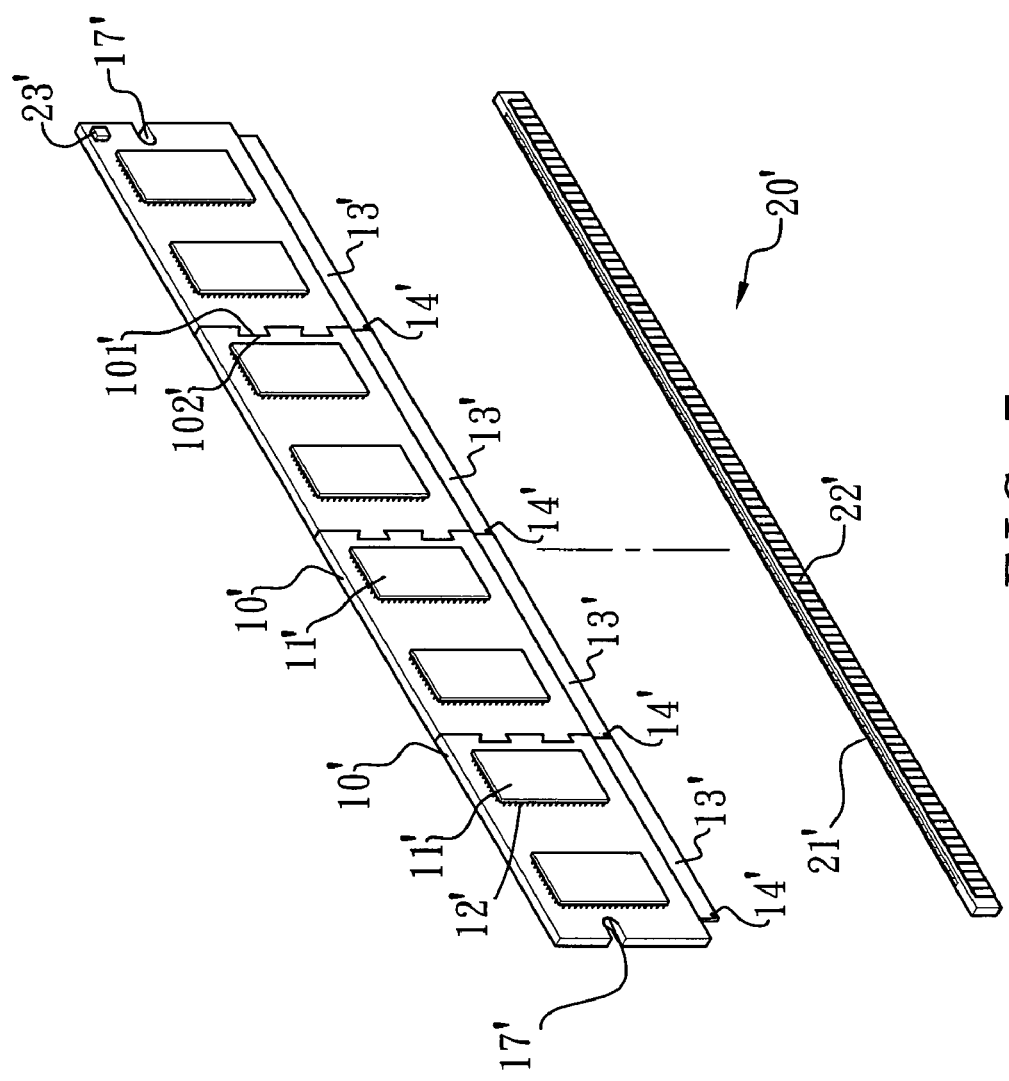
FIG. 5 is an alternative mode of the memory module according to the above preferred embodiment of the present invention.

Referring to FIG. 5 of the drawings, a first alternative mode of the memory module of the present invention is illustrated. The first alternative mode is similar to the above-mentioned preferred embodiment except that there is only one single elongated receiving slot 21' on the assembling holder 20' without the retaining means, wherein the signal terminal 22' is also provided on the elongated unit housing. Furthermore, the electric terminals 13' are downwardly extended from the respective memory substrate 10' to reach the elongated receiving slot 21' in such a manner that the contacting portion 14' of the respective electric terminal 13' is electrically connected with the conductive element 24.

Furthermore, as shown in FIG. 5 of the drawings, each of the memory units comprises two memory chipsets 11' electrically mounted on the memory substrate 10' via the respective chipset terminal 12'. The first and the second assembling joints 15, 16 are formed on two side edge portions of the corresponding memory substrate 10', with the first protruding teeth 101' securely and fittedly engaging with the second engaging slots 102' respectively.

Furthermore, the two mounting slots 17' are indently formed on an outer side edge portion of two memory substrates 10' of the two outermost memory units respectively wherein the mounting slots 17' are adapted for engaging with the respective holding arm 31 of the memory holder 30, as mentioned in the above preferred embodiment of the present invention.

Finally, the memory module also comprises an Electrically Erasable Programmable ROM (EEPROM) 23' electrically connected with one of the memory substrate 10' so as to comprehensively handle data from the individual memory substrates 10' and the respective memory chipsets 11', as mentioned in the above preferred embodiment.

Figure 6:
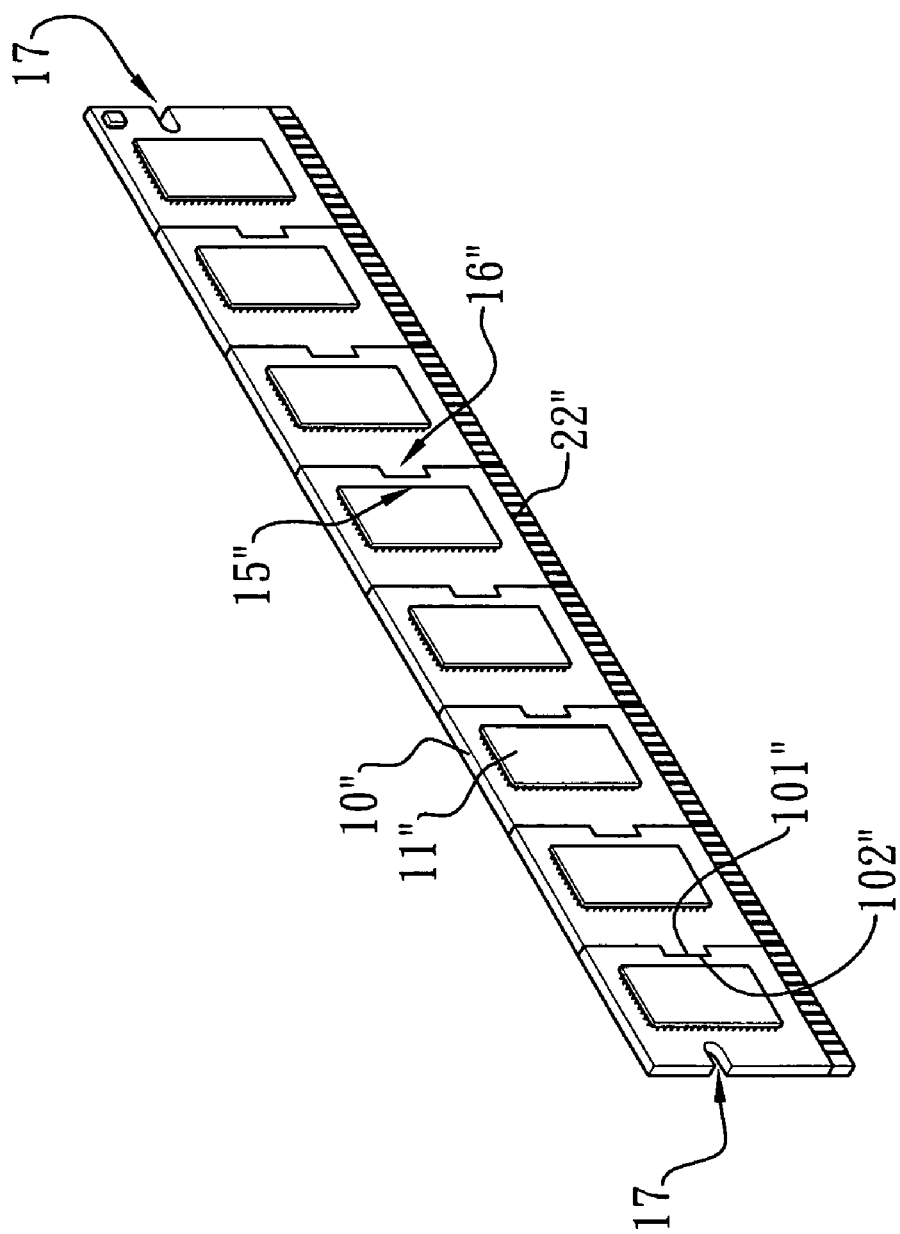
FIG. 6 is a schematic diagram of the alternative mode of the memory module according to the above preferred embodiment of the present invention.

FIG. 6 illustrates a second alternative mode of the memory module according to the preferred embodiment of the present invention. The second alternative mode is similar to the preferred embodiment except that the first assembling joint 15" of one memory substrate 10" has only one first protruding tooth 101", and that the second assembling joint 16" of an adjacent memory substrate 10" has only one second corresponding engaging slot 102". Thus, the first protruding tooth 101" is securely engaged with the second engaging slot 102" so that the memory units are adapted to fittedly insert into the receiving slot 21. Finally, as in the preferred embodiment, the elongated unit housing also has the signal terminal 22" to electrically contact with the memory holder 30 of the motherboard.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A memory module for mounting to a memory slot of a motherboard, comprising:

a plurality of memory units, each of which comprises a memory substrate, at least a memory chipset having a predetermined memory capacity mounted on said memory substrate, and an electric terminal provided at a lower edge portion of said memory substrate;

an assembling holder comprising an elongated unit housing having at least an elongated receiving slot extended therealong and a signal terminal provided along said unit housing; and an engaging arrangement which comprises a first assembling joint provided at a side edge portion of one of said memory substrates, and a second assembling joint provided at a corresponding side edge portion of an adjacent memory substrates, wherein said first assembling joint of said memory unit is fittedly and detachably engaged with said second assembling joint of said adjacent memory unit to alignedly couple said memory units with each other in an edge to edge manner to fittedly inset into said receiving slot of said elongated unit housing.

2. The memory module, as recited in claim 1, wherein said first assembling joint comprises at least a first protruding tooth integrally and outwardly protruded from a side edge portion of said memory substrate, and said second assembling joint has at least an second engaging slot which is shaped and sized to fittedly match with a shape and a size of said first protruding tooth of said first assembling joint so that when said first protruding tooth is fittedly engaged with said second engaging slot, said two memory units are securely and detachably interlocked with each other for fittedly inserting into said receiving slot.

3. The memory module, as recited in claim 2, wherein said first protruding tooth has an enlarged head portion sidewardly extended from said respective side edge portion of said memory substrate, and said second engaging slot has a shape which substantially matches said shape of said first protruding tooth such that said protruding tooth and said engaging slot is adapted to interlock with each other so as to detachably engage said two memory substrates for inserting into said receiving slot.

4. The memory module, as recited in claim 2, wherein said memory module further has two mounting slots indently formed on an outer side edge portion of said memory substrates of said two outermost memory units respectively, thereby, when said memory module is inserted into said memory slot of said motherboard, a holding arm of said motherboard is adapted to engage with said respective mounting slot of said respective memory substrate so as to securely lock up said memory module along said memory slot.

5. The memory module, as recited in claim 3, wherein said memory module further has two mounting slots indently formed on an outer side edge portion of said memory substrates of said two outermost memory units respectively, thereby, when said memory module is inserted into said memory slot of said motherboard, a holding arm of said motherboard is adapted to engage with said respective mounting slot of said respective memory substrate so as to securely lock up said memory module along said memory slot.

6. The memory module, as recited in claim 4, wherein said assembling holder further has a conductive element provided along an inner wall of said receiving slot of said elongated unit housing to electrically connect with said signal terminal, wherein said electric terminal of each of said memory substrate is electrically contacted with said conductive element when said electric terminal of said memory substrate is inserted into said receiving slot so that said memory units are electrically connected with said signal terminal through said conductive element.

7. The memory module, as recited in claim 5, wherein said assembling holder further has a conductive element provided along an inner wall of said receiving slot of said elongated unit housing to electrically connect with said signal terminal, wherein said electric terminal of each of said memory substrate is electrically contacted with said conductive element when said electric terminal of said memory substrate is inserted into said receiving slot so that said memory units are electrically connected with said signal terminal through said conductive element.

8. The memory module, as recited in claim 6, wherein said memory module further comprises an Electrically Erasable Programmable ROM electrically connected on one of said memory substrate so as to comprehensively handle data from individual of said memory substrates and said respective memory chipset.

9. The memory module, as recited in claim 7, wherein said memory module further comprises an Electrically Erasable Programmable ROM electrically connected on one of said memory substrate so as to comprehensively handle data from individual of said memory substrates and said respective memory chipset.

10. The memory module, as recited in claim 8, wherein said elongated unit housing further comprises a plurality of slot dividers formed along said elongated unit housing to divide said receiving slot into a plurality of slot portions therealong between each two said slot dividers in such a manner that lateral movement of each of said memory units is adapted to be substantially restricted by said corresponding slot divider.

11. The memory module, as recited in claim 9, wherein said elongated unit housing further comprises a plurality of slot dividers formed along said elongated unit housing to divide said receiving slot into a plurality of slot portions therealong between each two said slot dividers in such a manner that a lateral movement of each of said memory units is adapted to be substantially restricted by said corresponding slot divider.

12. The memory module, as recited in claim 2, wherein said second assembling joint further comprises a plurality of second protruding teeth spacedly and outwardly protruded from a side edge portion thereof to form a plurality of second engaging slots between each two second protruding teeth, wherein said first assembling joint further comprises a plurality of first protruding teeth spacedly and outwardly protruded from said side edge portion to form a plurality of first engaging slots between each two of said first protruding teeth, wherein said first protruding teeth are substantially aligned with said second engaging slots respectively, and said second protruding teeth are substantially aligned with said first engaging slots respectively, so that said two memory substrates are interlocked with each other through secure engagement between said first protruding teeth and said second engaging slots, and between said second protruding teeth and said first engaging slots.

13. The memory module, as recited in claim 12, wherein each of said first protruding teeth has an enlarged head portion sidewardly extended from said respective side edge portion of said memory substrate, and each of said second engaging slots has a shape which substantially matches said shape of said respective first protruding tooth such that said first protruding teeth and said second engaging slots are adapted to interlock with each other so as to detachably engage said two memory substrates for inserting into said receiving slot.

14. The memory module, as recited in claim 13, wherein said memory module further has two mounting slots indently formed on an outer side edge portion of said memory substrates of said two outermost memory units respectively, thereby, when said memory module is inserted into said memory slot of said motherboard, a holding arm of said computer motherboard is adapted to engage with said respective mounting slot of said respective memory substrate so as to securely lock up said memory module along said memory slot.

15. The memory module, as recited in claim 13, wherein said assembling holder further has a conductive element provided along an inner wall of said receiving slot of said elongated unit housing to electrically connect with said signal terminal, wherein said electric terminal of each of said memory substrate is electrically contacted with said conductive element when said electric terminal of said memory substrate is inserted into said receiving slot so that said memory units are electrically connected with said signal terminal through said conductive element.

16. The memory module, as recited in claim 14, wherein said assembling holder further has a conductive element provided along an inner wall of said receiving slot of said elongated unit housing to electrically connect with said signal terminal, wherein said electric terminal of each of said memory substrate is electrically contacted with said conductive element when said electric terminal of said memory substrate is inserted into said receiving slot so that said memory units are electrically connected with said signal terminal through said conductive element.

17. The memory module, as recited in claim 15, wherein said elongated unit housing further comprises a plurality of slot dividers formed along said elongated unit housing to divide said receiving slot into a plurality of slot portions therealong between each two said slot dividers in such a manner that a lateral movement of each of said memory units is adapted to be substantially restricted by said corresponding slot divider.

18. The memory module, as recited in claim 16, wherein said elongated unit housing further comprises a plurality of slot dividers formed along said elongated unit housing to divide said receiving slot into a plurality of slot portions therealong between each two said slot dividers in such a manner that a lateral movement of each of said memory units is adapted to be substantially restricted by said corresponding slot divider.

19. The memory module, as recited in claim 17, wherein said memory module further comprises an Electrically Erasable Programmable ROM electrically connected on one of said memory substrate so as to comprehensively handle data from individual of said memory substrates and said respective memory chipset.

20. The memory module, as recited in claim 18, wherein said memory module further comprises an Electrically Erasable Programmable ROM electrically connected on one of said memory substrate so as to comprehensively handle data from individual of said memory substrates and said respective memory chipset.

* * * * *